United States Patent
Jeon et al.

(10) Patent No.: US 7,289,002 B2
(45) Date of Patent: Oct. 30, 2007

(54) COMPLEMENTARY METAL OXIDE SEMICONDUCTOR VOLTAGE CONTROLLED OSCILLATOR

(75) Inventors: Sang-yoon Jeon, Seoul (KR); Heung-bae Lee, Suwon-si (KR); Sung-jae Jung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 73 days.

(21) Appl. No.: 11/355,976

(22) Filed: Feb. 17, 2006

(65) Prior Publication Data
US 2006/0197621 A1    Sep. 7, 2006

(30) Foreign Application Priority Data
Feb. 18, 2005    (KR) .................... 10-2005-0013772

(51) Int. Cl.
*H03B 5/12*    (2006.01)
(52) U.S. Cl. ................. 331/117 FE; 331/167; 331/117 R
(58) Field of Classification Search ......... 331/117 FE, 331/167, 117 R
See application file for complete search history.

(56) References Cited

U.S. PATENT DOCUMENTS

| | | | |
|---|---|---|---|
| 6,411,171 B2* | 6/2002 | Itoh ....................... | 331/117 R |
| 6,469,586 B1* | 10/2002 | Rogers et al. .......... | 331/117 R |
| 6,469,587 B2* | 10/2002 | Scoggins ................ | 331/117 R |
| 6,750,726 B1* | 6/2004 | Hung et al. ............. | 331/100 |
| 6,774,736 B1* | 8/2004 | Kwek et al. ............ | 331/177 V |
| 6,867,658 B1* | 3/2005 | Sibrai et al. ............ | 331/185 |

* cited by examiner

*Primary Examiner*—Joseph Chang
(74) *Attorney, Agent, or Firm*—Sughrue Mion Pllc.

(57) ABSTRACT

A complementary metal oxide semiconductor voltage controlled oscillator is provided. The voltage controlled oscillator includes an LC tank which is supplied with a power supply voltage, the LC tank oscillating at a certain frequency; a negative resistor including first and second N-channel metal oxide semiconductor field effect transistors (NMOS FETs) to sustain the oscillation of the LC tank; a direct current block to remove a direct current component from the power supply voltage; an alternating current block to apply an alternating current voltage to the gates of the first and second NMOS FETs; a first current mirror including third and fourth NMOS FETs and allowing a current to symmetrically flow in the voltage controlled oscillator, a drain and the gate of the third NMOS FET being connected to a reference voltage supply; and the reference voltage supply applying a direct current voltage to the first current mirror.

8 Claims, 4 Drawing Sheets

COMPLEMENTARY METAL OXIDE SEMICONDUCTOR VOLTAGE CONTROLLED OSCILLATOR

CROSS-REFERENCE TO RELATED APPLICATION

This application claims the benefit of Korean Patent Application No. 2005-13772, filed Feb. 18, 2005 in the Korean Intellectual Property Office, the disclosure of which is incorporated herein by reference.

BACKGROUND OF THE INVENTION

1. Field of the Invention

Apparatuses consistent with the present invention relate to a voltage controlled oscillator (VCO), and more particularly, to a complementary metal oxide semiconductor (CMOS) VCO applying a gate bias voltage independent of a power supply voltage VDD using a current mirror instead of a tail current source, and a stable power instead of the noisy power supply voltage VDD to an inverter buffer using the current mirror so as to reduce a phase noise.

2. Description of the Related Art

In general, VCOs are integrated circuit (IC) chips varying voltages to oscillate super high frequency having desired frequencies. Such a VCO is mainly used in analog synthesizers, mobile communication terminals, personal mobile communications terminals, base stations, and other communications equipment known in the art, and outputs a desired oscillator frequency using a voltage applied from an external source.

In the VCO, an output frequency linearly varies with a linear variation in a voltage. Thus, a frequency of an output signal is proportional to an intensity of an input signal. Therefore, the VCO can be effectively used in a frequency modulator.

FIG. 1 is a circuit diagram of a conventional VCO including a noise filter. Referring to FIG. 1, the conventional VCO includes an inductance-capacitance (LC) tank 110 including inductors L11 and L12 and varactor diodes D11 and D12 to oscillate a frequency, a negative resistor 120 sustaining the oscillation of the LC tank 110, a tail current source 130 allowing a current to symmetrically flow in the VCO, and a noise filter 140 preventing noise generated from the tail current source 130 from flowing in the VCO.

The LC tank 110 includes first and second resonators symmetric with respect to a control voltage Vc, the first resonator includes a first inductor L11 and a first varactor diode D11 connected to each other, and the second resonator includes a second inductor L12 and a second varactor diode D12 connected to each other.

The negative resistor 120 includes first and second N-channel Metal Oxide Semiconductor Field Effect Transistors (NMOS FETs) MN11 and MN12, and a drain of the first NMOS FET MN11 is connected to a node P to which an end of the first inductor L11 and anode of the first varactor diode D11 are connected in common. A gate of the first NMOS FET MN11 is connected to a node N to which an end of the second inductor L12 and an anode of the second varactor diode D12 are connected in common. Symmetrically, a drain of the second NMOS FET MN12 is connected to the node N, and a gate of the second NMOS FET MN12 is connected to the node P.

The tail current source 130 includes an NMOS FET. The noise filter 140 is connected between sources of the first and second NMOS FETs MN11 and MN12 and a drain of the tail current source 130, and includes an inductor L13 and a bypass capacitor C13.

The conventional VCO shown in FIG. 1 is supplied with a power supply voltage VDD from a power source and varies capacitances of the first and second varactor diodes D11 and D12 using the control voltage Vc to control an oscillator frequency output from the LC tank 110. The negative resistor 120 having a negative resistance is added to the LC tank 110 so as to sustain the oscillator signal.

The conventional VCO shown in FIG. 1 is a differential VCO and outputs an oscillator signal having a phase difference of 180° via the nodes P and N as output nodes. Capacitors C11 and C12 connected to the nodes P and N, respectively, are bypass capacitors bypassing the output oscillator signal. A drain of the NMOS FET of the tail current source 130 is connected to a source of the negative resistor 120 so that the same current flows in sources of the first and second NMOS FETs MN11 and MN12 of the negative resistor 120.

However, a 1/f noise generated from the NMOS FET of the tail current source 130 and upconverted appears in an output of the conventional VCO. The 1/f noise is called a flicker noise. The inductor L13 having a large inductance is inserted between the negative resistor 120 and the tail current source 130 to control the 1/f noise. A noise that has not passed through the inductor L13 is bypassed by the bypass capacitor C13.

Thus, the conventional VCO shown in FIG. 1 must use an additional passive element to control the 1/f noise of the tail current source 130.

FIG. 2 is a circuit diagram of inverter buffers connected to output nodes of a conventional VCO. Since the conventional VCO shown in FIG. 1 has a differential structure, an output node is divided into nodes P and N. Thus, input nodes of the inverter buffers are each divided into nodes P and N.

A first inverter 210 shown in FIG. 2 includes a PMOS FET MP21 and an NMOS FET MN21 that have different polarities, and their gates and drains are coupled together. A power supply voltage VDD is connected to a source of the PMOS FET MP21, and a source of the NMOS FET MN21 is connected to a ground voltage VSS. Components of a second inverter buffer 220 are connected using the same method by which the components of the first inverter 210 have been connected. Components of third and fourth inverter buffers 230 and 240 are connected using the same method by which the components of the first inverter buffer 210 have been connected, and thus their descriptions will be omitted.

The first inverter buffer 210, connected to an output node $V_{IP}$ of the conventional VCO shown in FIG. 1, is driven by the power supply voltage VDD and increases an amplitude of an output oscillator signal of the conventional VCO. Thus, a full swing is output to increase a power of the output oscillator signal. As a result, a phase noise of the conventional VCO can be controlled using an inversely proportional relationship of the power to the phase noise.

However, the phase noise of the conventional VCO is increased by an effect of a noise of the power supply voltage VDD connected to the first inverter buffer 210. In other words, the characteristic of the phase noise is deteriorated. The second, third, and fourth inverter buffers 220, 230, and 240 operate in the same way, and thus the phase noise is increased.

Accordingly, in a scheme of controlling a phase noise of a conventional VCO, an additional passive element is used to control a 1/f noise generated from a tail current source and upcoverted. Also, inverter buffers are used to increase a power so as to control the phase noise of an oscillator signal of the conventional VCO. As a result, the phase noise is increased by effects of noises of power supply voltages VDD of the inverter buffers.

SUMMARY OF THE INVENTION

According to an aspect of the present invention, there is provided a CMOS VCO applying a gate bias voltage independent of a power supply voltage VDD using a current mirror instead of a tail current source, and supplying a stable power instead of the noisy power supply voltage VDD to an inverter buffer using the current mirror so as to reduce a phase noise.

According to an exemplary embodiment of the present invention, there is provided a complementary metal oxide semiconductor voltage controlled oscillator, including an LC tank which is supplied with a power supply voltage VDD, the LC tank including a node P to which an end of a first inductor and an anode of a first variable capacitor are coupled and a node N to which an end of a second inductor and an anode of a second variable capacitor are coupled, and oscillating at a frequency; a negative resistor including first and second N-channel metal oxide semiconductor field effect transistors and having a negative resistance to sustain the oscillation of the LC tank; a direct current block including a first capacitor through which the node N is coupled to a gate of the first N-channel metal oxide semiconductor field effect transistor and a second capacitor through which the node P is coupled to a gate of the second N-channel metal oxide semiconductor field effect transistor and removing a direct current component from the power supply voltage VDD; an alternating current block including first resistor through which gates of the first and a third N-channel metal oxide semiconductor field effect transistors are coupled and a second resistor through which gates of the second and a fourth N-channel metal oxide semiconductor field effect transistors are coupled and applying an alternating current voltage having passed through the direct current block to the gates of the first and second N-channel metal oxide semiconductor field effect transistors; a first current mirror including the third and fourth N-channel metal oxide semiconductor field effect transistors, and allowing a current to symmetrically flow in the complementary metal oxide semiconductor voltage controlled oscillator, a gate of the third N-channel metal oxide semiconductor field effect transistor being coupled to the first resistor, a gate of the fourth N-channel metal oxide semiconductor field effect transistor being coupled to the second resistor, and a drain and the gate of the third N-channel metal oxide semiconductor field effect transistor being coupled to a reference voltage supply; and the reference voltage supply applying a direct current voltage to the drain and gate of the third N-channel metal oxide semiconductor field effect transistor to supply a voltage to the first current mirror.

The LC tank may include the first and second inductors, and the first and second variable capacitors.

In the negative resistor, a drain of the first N-channel metal oxide semiconductor field effect transistor may be coupled to the node P, the gate of the first N-channel metal oxide semiconductor field effect transistor may be coupled through the first capacitor to the node N, a drain of the second N-channel metal oxide semiconductor field effect transistor may be coupled to the node N, and a gate of the second N-channel metal oxide semiconductor field effect transistor may be coupled through the second capacitor to the node P.

The complementary metal oxide semiconductor voltage controlled oscillator may further include a second current mirror including first, second, and third P-channel metal oxide semiconductor field effect transistors, a drain of the first P-channel metal oxide semiconductor field effect transistors and gates of the first, second, and third P-channel metal oxide semiconductor field effect transistors being coupled to the drain of the fourth N-channel metal oxide semiconductor field effect transistor and sources of the first, second, and third P-channel metal oxide semiconductor field effect transistors being coupled to the power supply voltage VDD, and removing an effect of a noise of the power supply voltage VDD; and an inverter buffer coupled to drains of the second and third P-channel metal oxide semiconductor field effect transistors, driven by the power supply voltage VDD supplied by the second current mirror, and increasing an amplitude of an oscillator signal output from the complementary metal oxide semiconductor voltage controlled oscillator.

The first and second variable capacitors of the LC tank may be varactor diodes.

The reference voltage supply may be a voltage regulator including a complementary metal oxide semiconductor band gap-based reference voltage circuit.

The gates of the third and fourth N-channel metal oxide semiconductor field effect transistors of the first current mirror may be coupled to each other so as to form a symmetric mirror structure.

Gates of the first, second, and third P-channel metal oxide semiconductor field effect transistors of the second current mirror may be coupled to one another so as to form a symmetric mirror structure.

BRIEF DESCRIPTION OF THE DRAWINGS

The above and other aspects of the present invention will be more apparent by describing certain exemplary embodiments of the present invention with reference to the accompanying drawings, in which.

DETAILED DESCRIPTION OF EXEMPLARY EMBODIMENTS OF THE PRESENT INVENTION

Figure 1:
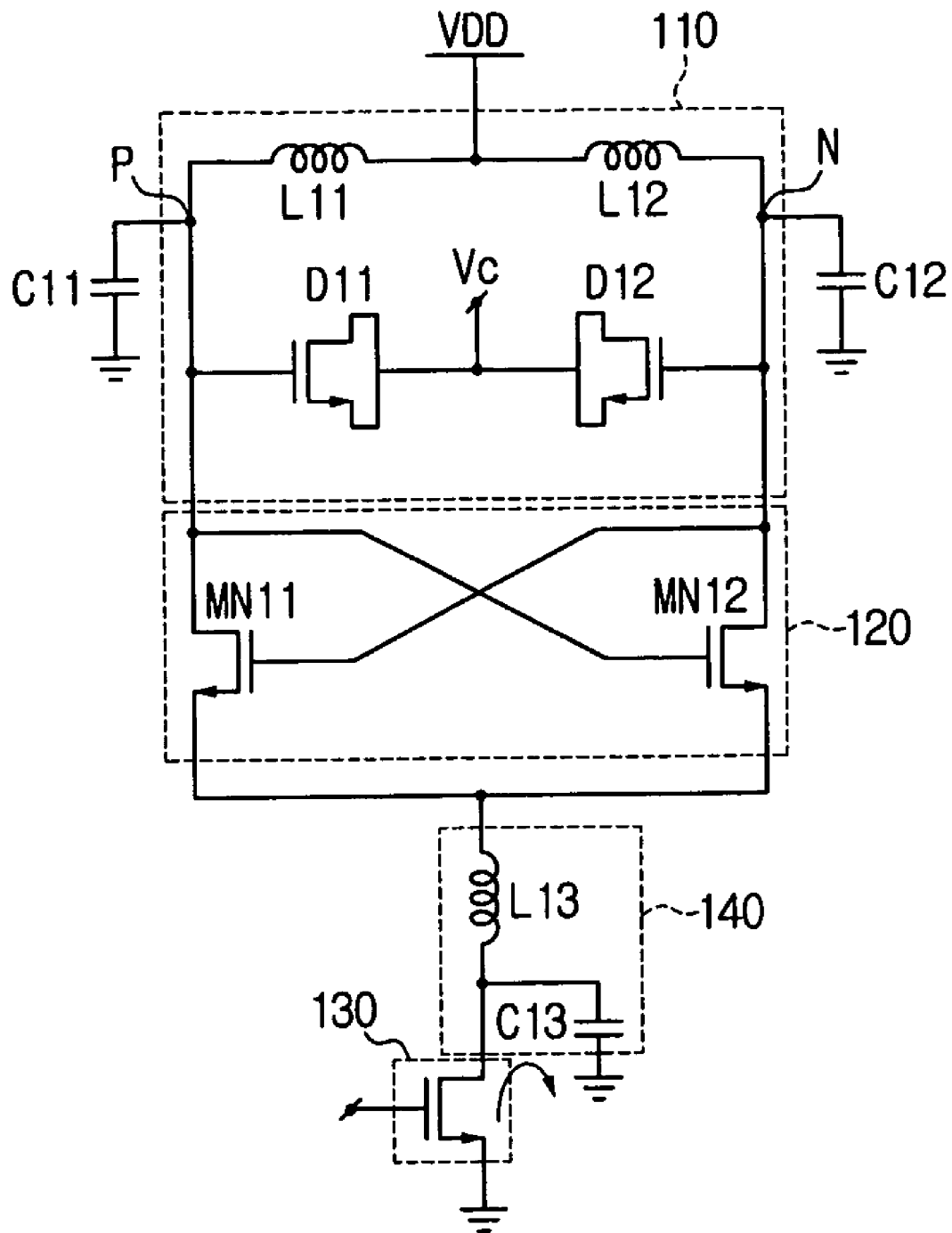
FIG. 1 is a circuit diagram of a conventional VCO including a noise filter.
Figure 2:
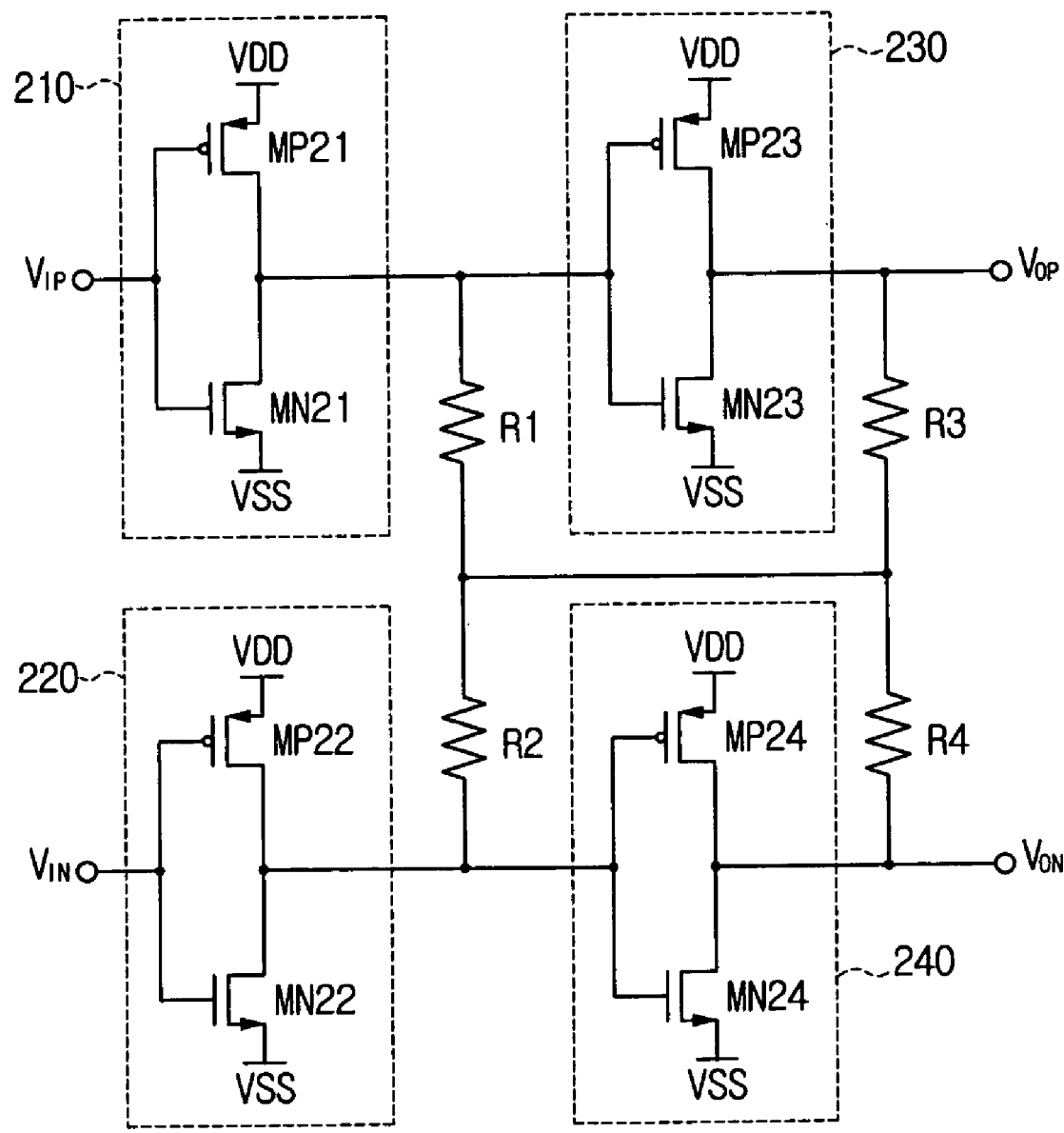
FIG. 2 is a circuit diagram of inverter buffers connected to output nodes of a conventional VCO.

Certain exemplary embodiments of the present invention will be described in greater detail with reference to the accompanying drawings.

In the following description, same drawing reference numerals are used for the same elements even in different drawings. The matters defined in the description such as a detailed construction and elements are provided to assist one skilled in the art in attaining a comprehensive understanding of the invention. Thus, it is apparent that exemplary embodiments of the present invention can be carried out without those defined matters. Also, well-known functions or constructions are not described in detail since they would obscure the invention in unnecessary detail.

Figure 3:
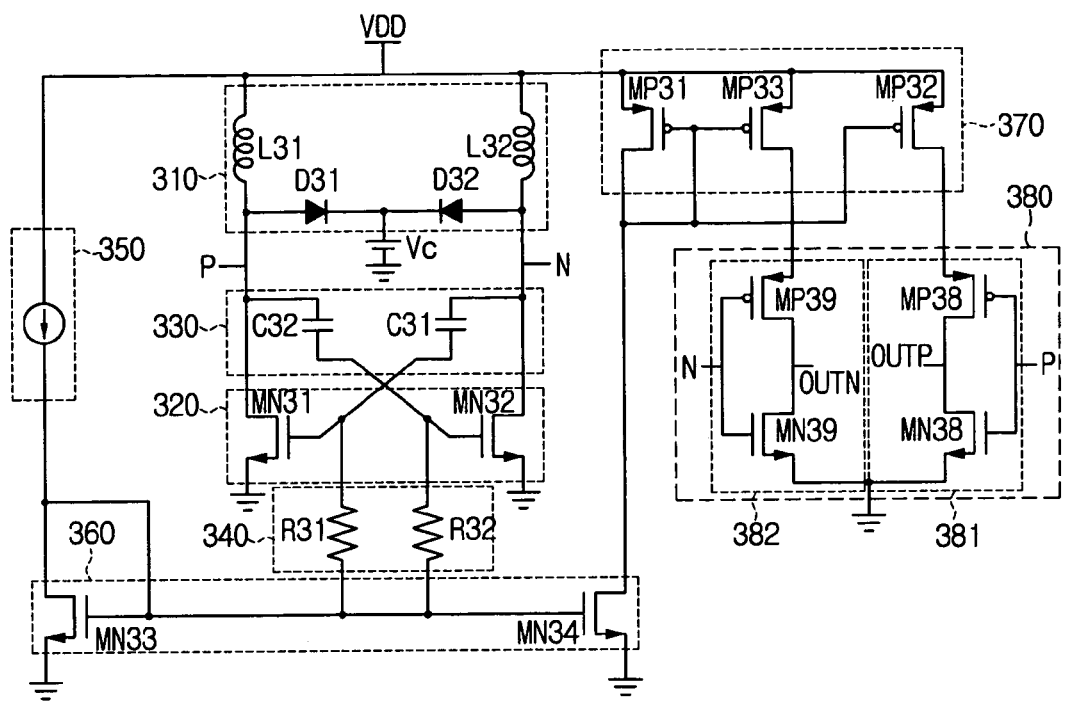
FIG. 3 is a circuit diagram of a VCO according to an exemplary embodiment of the present invention.

FIG. 3 is a circuit diagram of a VCO according to an exemplary embodiment of the present invention. Referring to FIG. 3, the VCO includes an LC tank 310 including first and second inductors L31 and L32 and first and second varactor diodes D31 and D32 to oscillate a frequency, a negative resistor 320 sustaining the oscillation of the LC tank 310, a direct current (DC) block 330 removing a DC voltage component, an alternating current (AC) block 340 applying an AC voltage component to a gate of an NMOS FET of the negative resistor 320, a reference voltage supply 350 supplying a voltage to first and second current mirrors 360 and 370, the first current mirror 360 allowing a current to symmetrically flow in the VCO, the second current mirror 370 removing an effect of a noise of a power supply voltage VDD, and an inverter buffer 380 increasing an amplitude of an oscillator signal output from the VCO.

The LC tank 310 includes first and second resonators symmetric with respect to a control voltage Vc, the first resonator includes the first inductor L31 and a first variable capacitor D31 coupled to each other, and the second resonator includes the second inductor L32 and a second variable capacitor D32 coupled to each other. The first and second variable capacitors D31 and D32 may be varactor diodes.

The negative resistor 320 includes first and second NMOS FETs MN31 and MN32, and a drain of the first NMOS FET MN31 is connected to a node P to which an end of the first inductor L31 and an anode of the first varactor diode D31 are connected in common. A gate of the first NMOS FET MN31 is coupled through a first capacitor C31 to a node N to which an end of the second inductor L32 and an anode of the second varactor diode D32 are connected in common. A source of the first NMOS FET MN31 is grounded.

Symmetrically, a drain of the second NMOS FET MN32 is connected to the node N, and a gate of the second NMOS FET MN32 is coupled through a second capacitor C32 to the node P. A source of the second NMOS FET MN32 is grounded. The gates of the first and second NMOS FETs MN31 and MN32 are coupled to the first current mirror 360 through first and second resistors R31 and R32. The drain of the first NMOS FET MN31 is coupled through the second capacitor C32 to the gate of the second NMOS FET MN32, and the drain of the second NMOS FET MN32 is coupled through the first capacitor C31 to the gate of the first NMOS FET MN31.

The DC block 330 includes the first and second capacitors C31 and C32. The first capacitor C31 is connected between the node N and the gate of the first NMOS FET MN31, and the second capacitor C32 is symmetrically connected between the node P and the gate of the second NMOS FET MN32.

The AC block 340 includes the first and second resistors R31 and R32, the first resistor R31 is connected between the gate of the first NMOS FET MN31 and a gate of a third NMOS FET MN33, and the second resistor R32 is connected between the gate of the second NMOS FET MN32 and a gate of a fourth NMOS FET MN34.

The reference voltage supply 350 includes a DC source and may be connected to the power supply voltage VDD or may be separately realized. In this latter case, the reference voltage supply 350 may be a voltage regulator including a CMOS band gap-based reference voltage circuit, or other such voltage circuit known in the art. An output of the reference voltage supply 350 may be connected to a drain and the gate of the third NMOS FET MN33.

The first current mirror 360 includes a third and fourth NMOS FETs MN33 and MN34, the drain and gate of the third NMOS FET MN33 are connected to the reference voltage supply 350, and a source of the third NMOS FET MN33 is grounded. The gates of the third and fourth NMOS FETs MN33 and MN34 are coupled together so as to form a symmetric mirror structure.

The second current mirror 370 includes first, second, and third PMOS FETs MP31, MP32, and MP33, and the drain of the fourth NMOS FET MN34 is coupled to gates of the first, second, and third PMOS FETs MP31, MP32, and MP33 and a drain of the first PMOS FET MP31. Sources of the first, second, and third PMOS FETs MP31, MP32, and MP33 are connected to the power supply voltage VDD. Drains of the second and third PMOS FETs MP32 and MP33 are coupled to the inverter buffer 380.

The inverter buffer 380 includes a first inverter buffer 381 connected to the node P of the VCO and a second inverter buffer 382 connected to the node N. The first inverter buffer 381 includes a PMOS FET MP38 and an NMOS FET MN38, whose gates are coupled together and whose drains are coupled together. The drain of the second PMOS FET MP32 is coupled to a source of the PMOS FET MP38, and a source of the NMOS FET MN38 is grounded.

Components of the second inverter buffer 382 are connected using the method by which the components of the first inverter buffer 381 have been connected. However, a drain of the third PMOS FET MP33 is coupled to a source of the PMOS FET MP39.

The operation of the VCO according to an exemplary embodiment of the present invention will now be described with reference to FIG. 3. A power source supplies the power supply voltage VDD and capacitances of the first and second varactor diodes D31 and D32 vary due to the control voltage Vc so as to control the oscillator frequency output from the LC tank 310. The negative resistor 320 having a negative resistance is added to the LC tank 310 to sustain the oscillator signal.

The VCO according to an exemplary embodiment of the present invention is a differential VCO as shown in FIG. 3 and outputs the oscillator signal having a phase difference of 180° via the nodes P and N. A DC voltage component of the power supply voltage VDD is removed through the first capacitor C31 at the node N so as to apply an AC voltage to the gate of the first NMOS FET MN31 of the negative resistor 320. The first resistor R31 having a large resistance value is connected to the gate of the first NMOS FET MN31 so as to apply the AC voltage to the gate of the first NMOS FET MN31. The second NMOS FET MN32, the second capacitor C32, and the second resistor R32 are symmetrically coupled together so that the same drain current flows in the first and second NMOS FETs MN31 and MN32.

The reference voltage supply 350 applies the DC voltage to the drain and gate of the third NMOS FET MN33 to control the third NMOS FET MN33. The third and fourth NMOS FETs MN 33 and MN34 are current mirrors, and a current flowing in the third NMOS FET MN33 is proportional to sizes of the third and fourth NMOS FETs MN33 and MN34 and thus flows in the fourth NMOS FET MN34. The sizes of the third and fourth NMOS FETs MN33 and MN34 are expressed with products of lengths and widths of the gates. A voltage applied to the gates of the third and fourth NMOS FETs MN33 and MN34 is applied to the first and second resistors R31 and R32 so as to apply the AC voltage to the gate of the first NMOS FET MN31 and the second NMOS FET MN32.

A drain voltage of the fourth NMOS FET MN34 is the same as gate voltages of the first, second, and third PMOS FETs MP1, MP32, and MP33 of the second current mirror 370. Currents of the second and third PMOS FETs MP32 and MP33 are controlled by the gate voltages, and the power supply voltage VDD flows through the second and third PMOS FETs MP32 and MP33 to be applied to the inverter buffer 380 with a noise thereof controlled.

The first inverter buffer 381 connected to the node P of the VCO is driven by the second PMOS FET MP32 and increases an amplitude of the oscillator signal output from the VCO. Thus, a full swing is output so as to increase a power of the oscillator signal. A stable power instead of the noisy power supply voltage VDD is supplied to the inverter buffer 380 using the second current mirror 370 so as to reduce a phase noise of the VCO. The second inverter buffer 382 operates in the same way to output the oscillator signal having the reduced phase noise via the node N.

Figure 4A:
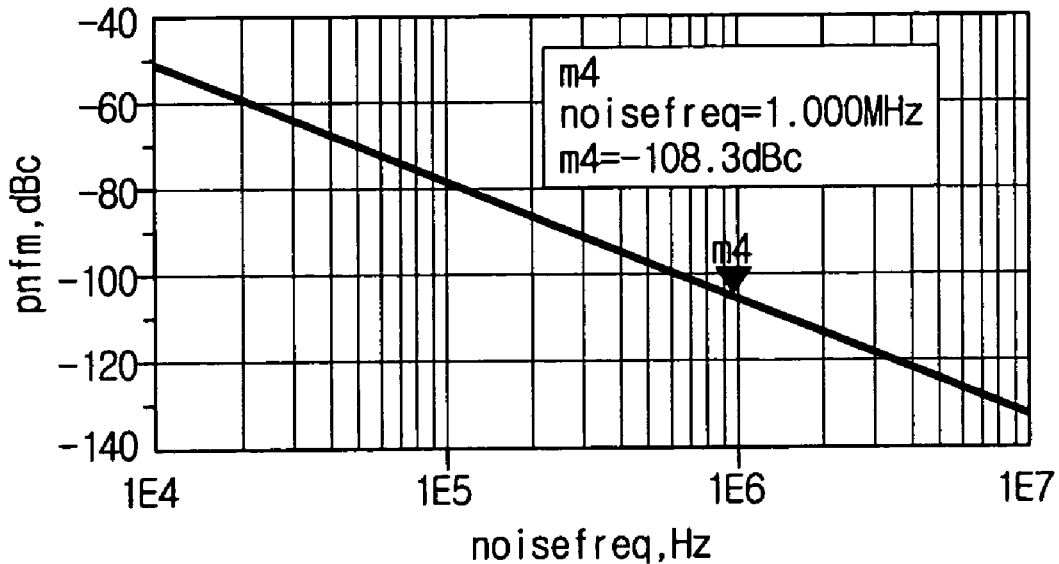
FIG. 4A is a graph illustrating results of a simulation of a noise characteristic of a conventional VCO.
Figure 4B:
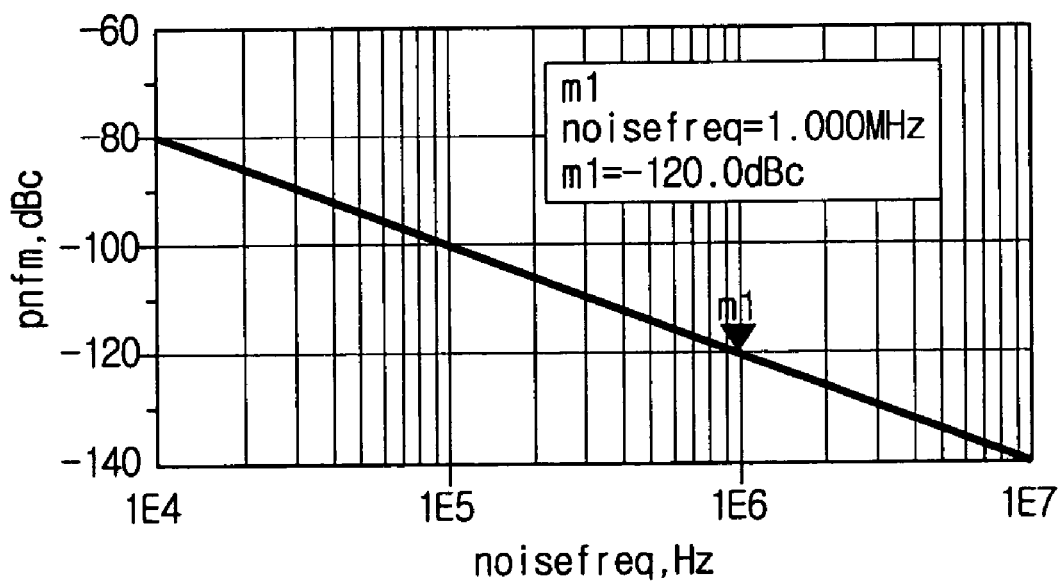
FIG. 4B is a graph illustrating results of a simulation of a noise characteristic of a VCO according to an exemplary embodiment of the present invention.

FIG. 4A is a graph illustrating results of a simulation of a noise characteristic of a conventional VCO using a tail current source and directly applying a power source VDD to an inverter buffer, the simulation being performed at an offset of 1 MHz using an agilent Advance Design System (ADS). FIG. 4B is a graph illustrating results of a simulation of a noise characteristic of a VCO of an exemplary embodiment of the present invention not including a tail current source and indirectly connecting a power source VDD to an inverter buffer, the simulation being performed at an offset of 1 MHz.

As shown in FIG. 4A, in the conventional VCO, a noise frequency is about −108.3 dBc at m4. As shown in FIG. 4B, in the VCO of an exemplary embodiment of the present invention, a noise frequency is −120.0 dBc at m1. Thus, a phase noise of the VCO of an exemplary embodiment of the present invention is reduced.

As described above, in a CMOS VCO according to an exemplary embodiment of the present invention, a gate bias voltage independent of a power supply voltage VDD can be applied using a current mirror instead of a tail current source. Thus, a phase noise of the CMOS VCO can be reduced. Also, a stable power instead of the power supply voltage VDD having a noise can be applied to an inverter buffer using the current mirror. As a result, a full swing can be output so as to reduce the phase noise.

The foregoing embodiments and advantages are merely exemplary and are not to be construed as limiting the present invention. The present teaching can be readily applied to other types of apparatuses. Also, the description of the exemplary embodiments of the present invention are intended to be illustrative, and not to limit the scope of the claims, and many alternatives, modifications, and variations will be apparent to those skilled in the art.

What is claimed is:

1. A voltage controlled oscillator, comprising:

an inductance-capacitance (LC) tank which is supplied with a power supply voltage and oscillates at a frequency, the LC tank comprising a first node to which an end of a first inductor and an anode of a first variable capacitor are coupled, and a second node to which an end of a second inductor and an anode of a second variable capacitor coupled;

a negative resistor which comprises first and second N-channel metal oxide semiconductor field effect transistors, the negative resistor having a negative resistance to sustain the oscillation of the LC tank;

a direct current block which comprises a first capacitor through which the second node is coupled to a gate of the first N-channel metal oxide semiconductor field effect transistor, and a second capacitor through which the first node is coupled to a gate of the second N-channel metal oxide semiconductor field effect transistor, and removing a direct current component from the power supply voltage;

an alternating current block which comprises a first resistor through which gates of the first and a third N-channel metal oxide semiconductor field effect transistors are coupled, and a second resistor through which gates of the second and a fourth N-channel metal oxide semiconductor field effect transistors are coupled, the alternating current block applying an alternating current voltage having passed through the direct current block to the gates of the first and second N-channel metal oxide semiconductor field effect transistors;

a first current mirror which comprises the third and fourth N-channel metal oxide semiconductor field effect transistors, and allows a current to symmetrically flow in the complementary metal oxide semiconductor voltage controlled oscillator, a gate of the third N-channel metal oxide semiconductor field effect transistor being coupled to the first resistor, a gate of the fourth N-channel metal oxide semiconductor field effect transistor being coupled to the second resistor, and a drain and the gate of the third N-channel metal oxide semiconductor field effect transistor being coupled to a reference voltage supply; and the reference voltage supply which applies a direct current voltage to the drain and gate of the third N-channel metal oxide semiconductor field effect transistor to supply a voltage to the first current mirror.

2. The complementary metal oxide semiconductor voltage controlled oscillator of claim 1, wherein the LC tank comprises the first and second inductors, and the first and second variable capacitors.

3. The complementary metal oxide semiconductor voltage controlled oscillator of claim 1, wherein the first and second variable capacitors of the LC tank are varactor diodes.

4. The complementary metal oxide semiconductor voltage controlled oscillator of claim 1, wherein in the negative resistor, a drain of the first N-channel metal oxide semiconductor field effect transistor is coupled to the first node, the gate of the first N-channel metal oxide semiconductor field effect transistor is coupled through a first capacitor to the second node, a drain of the second N-channel metal oxide semiconductor field effect transistor is coupled to the second node, and a gate of the second N-channel metal oxide semiconductor field effect transistor is coupled through a second capacitor to the first node.

5. The complementary metal oxide semiconductor voltage controlled oscillator of claim 1, further comprising:

a second current mirror which comprises first, second, and third P-channel metal oxide semiconductor field effect transistors, and removes an effect of a noise of the power supply, a drain of the first P-channel metal oxide semiconductor field effect transistor and gates of the first, second, and third P-channel metal oxide semiconductor field effect transistors being coupled to the drain of the fourth N-channel metal oxide semiconductor field effect transistor, and sources of the first, second, and third P-channel metal oxide semiconductor field effect transistors being coupled to the power supply voltage; and an inverter buffer which is connected to drains of the second and third P-channel metal oxide semiconductor field effect transistors driven by the power supply voltage supplied by the second current mirror, and increases an amplitude of an oscillator signal output from the complementary metal oxide semiconductor voltage controlled oscillator.

6. The complementary metal oxide semiconductor voltage controlled oscillator of claim 1, wherein the reference voltage supply is a voltage regulator comprising a complementary metal oxide semiconductor band gap-based reference voltage circuit.

7. The complementary metal oxide semiconductor voltage controlled oscillator of claim 1, wherein the gates of the third and fourth N-channel metal oxide semiconductor field effect transistors of the first current mirror are coupled to each other so as to form a symmetric mirror structure.

8. The complementary metal oxide semiconductor voltage controlled oscillator of claim 5, wherein gates of the first, second, and third P-channel metal oxide semiconductor field effect transistors of the second current mirror are coupled to one another so as to form a symmetric mirror structure.

* * * * *